United States Patent [19]

Botti et al.

[11] Patent Number: 4,918,370
[45] Date of Patent: Apr. 17, 1990

[54] LOW VOLTAGE-CONTROLLED, STAND-BY ELECTRONIC CIRCUIT WITH DELAYED SWITCH OFF

[75] Inventors: Edoardo Botti, Mortara; Massimo Nisetto, Padua, both of Italy

[73] Assignee: SGS-Thomson Microelectronics s.r.l., Agrate Brianza Mi, Italy

[21] Appl. No.: 356,810

[22] Filed: May 25, 1989

[30] Foreign Application Priority Data

May 26, 1988 [IT] Italy .............................. 20758 A/88

[51] Int. Cl.$^4$ ................................................ G05F 3/16
[52] U.S. Cl. .................................... 323/351; 323/317; 307/597
[58] Field of Search ............... 323/312, 315, 316, 317, 323/351, 282, 284, 285, 288; 307/590, 592, 597

[56] References Cited

U.S. PATENT DOCUMENTS

| | | | |
|---|---|---|---|
| 2,923,863 | 2/1960 | Chesson et al. | 307/597 |
| 3,721,832 | 3/1973 | Lee | 307/597 |
| 3,784,881 | 1/1974 | Van Horn et al. | 307/597 |
| 4,639,661 | 1/1987 | Williams et al. | 323/351 |
| 4,810,902 | 3/1989 | Storti et al. | 323/317 |

Primary Examiner—Peter S. Wong
Attorney, Agent, or Firm—Guido Modiano; Albert Josif

[57] ABSTRACT

This low voltage-controlled, stand-by electronic circuit with delayed switch off, comprises a switching circuit defining a stand-by input receiving a stand-by switching signal and an output, and a delay circuit generating a delayed switch off signal. The switching circuit comprises a controlled current source having two control inputs, one whereof is connected to the stand-by input for switching on the controlled current source upon receiving the stand-by switching signal and the other of the inputs is connected to the delay circuit. The delay circuit is also connected to the stand-by input and receives therefrom the stand-by switching signal for generating the delayed switch off signal, so that the controlled current source is switched on upon receiving the stand-by switching signal and remains on in absence of the stand-by switching signal and of the delayed switch off signal, the controlled current source being switched off by the delayed switch off signal on the second control input.

7 Claims, 3 Drawing Sheets

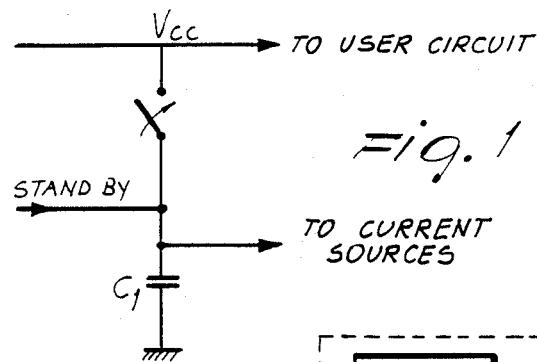
Fig. 1 PRIOR ART
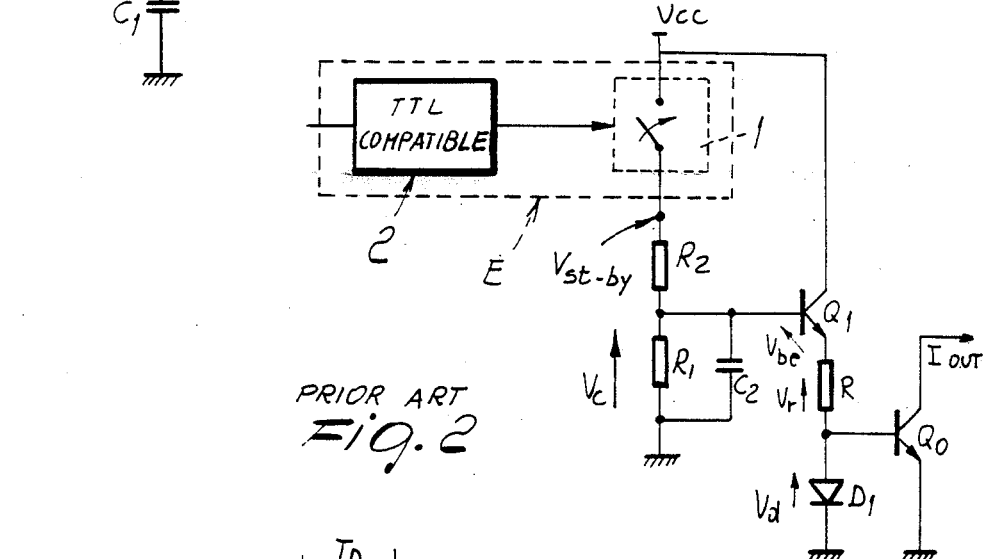
PRIOR ART
Fig. 2
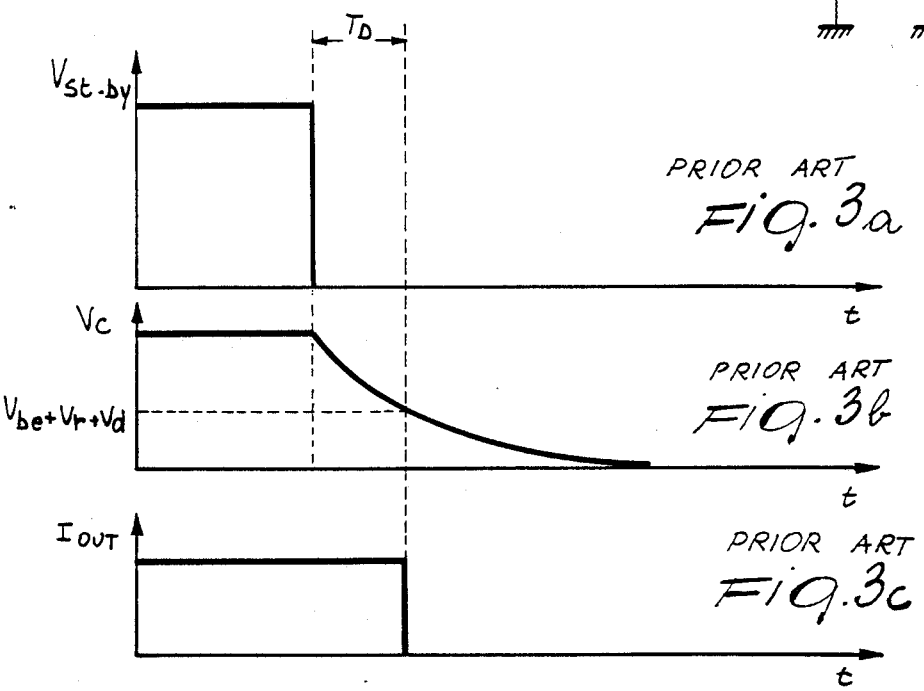
PRIOR ART
Fig. 3a
PRIOR ART
Fig. 3b
PRIOR ART
Fig. 3c

LOW VOLTAGE-CONTROLLED, STAND-BY ELECTRONIC CIRCUIT WITH DELAYED SWITCH OFF

BACKGROUND OF THE INVENTION

The present invention relates to a low voltage-controlled, stand-by electronic circuit with delayed switch off, in particular of the type used to interrupt or switch off the connection of electronic user devices comprising components which are susceptible to a sharp switching off.

As is known, electronic switch-off circuits which comprise a so-called stand-by unit are used to interrupt current flowing in electronic components; said stand-by circuits keep said components live - with practically no current absorption - even when the apparatus comprising said components is switched off.

A stand-by switch-off circuit is a two-state device (i.e. it can be either in the "on" position or in the "off" position) and may be voltage-controlled; in general the stand-by switching voltage is set according to the various technologies. For example, if the stand-by circuit is TTL-compatible, the switch-off voltage level should be lower than 0.8 V, while the switch-on voltage level should be higher than 2.0 V.

An example of the use of a stand-by circuit is the switching off of a radio receiver or television set by means of a remote control: the radio receiver or television set remains connected to the power supply but its current absorption is practically nil.

In this case however a problem arises if the radio receiver or television set is suddenly switched off, causing an unpleasant acoustic effect.

In order to solve this problem, it is known to combine a stand-by circuit with a delay circuit; the delay thus obtained extends the switch-off time of said components. Such a combination of a stand-by circuit and of a delay circuit is known in the literature (see e.g. FIG. 1).

The known solution teaches the use of a switching circuit connecting the power supply Vcc pin and the stand-by pin. However, this solution entails the use of two circuits (the stand-by circuit and the circuit for switching said stand-by circuit) and therefore entails a lower integration. Otherwise, if the switching function is integrated, the delay circuit should be connected to an external capacitor C1, thereby requiring an opposite pin to this end, which is considered disadvantageous.

A different solution is mentioned in the SGS Data Book, and in particular with reference to the integrated component termed TDA 7360 by SGS. A typical embodiment of the proposed solution is illustrated in FIG. 2. The block 1 and the block 2 are external (see the dot-and-dash lines which define block E). Control block 2, which is either CMOS or TTL-compatible, controls opening and closing of switching block 1, which in turn controls the operation of the current sources comprised in the user (one of which is schematically represented in FIG. 2 by transistor Q10): when block 1 is in the "on" position (i.e. the switch is closed) the transistor Q1 of the delay stage (also comprising resistors R, R1, R2; capacitor C2 and diode D1) is on and the output voltage Iout is not zero. The capacitor C2 is charged at a voltage Vc which is greater than the threshold voltage of said user circuit or equal thereto; said threshold voltage is given by the sum of the voltage drops Vbe (base-to-emitter voltage transistor Q1)+Vr (voltage across the resistor R)+Vd (voltage across diode D1). When block 1 is in its "off" position (i.e. open), the capacitor C2 discharges with the time constant Td which is equal to R1.C2 (see FIG. 3): therefore Vc decreases (as also shown in FIG. 3). When Vc drops below the threshold voltage of the circuit formed by Q1, R and D1, the transistor Q1 switches to the "off" condition, thereby switching off the generic current source Q0 so that its output current Iout is nil. The delay time TD is illustrated in FIG. 3.

The described known circuit has some disadvantages, among which a high switch-off threshold voltage may be mentioned.

SUMMARY OF THE INVENTION

The aim of the present invention is to eliminate the above described disadvantages by providing an electronic switch-off stand-by circuit (for example for a radio receiver or for a television set) requiring a control voltage with a very low threshold.

An object of the invention is to provide said circuit without resorting to specially provided external means yet achieving a convenient delay.

A consequent object of the invention is to reduce the bulk, by eliminating additional terminals or pins which would be required for connecting any external means.

This aim, the objects mentioned and others which will become apparent hereinafter are achieved by an electronic switch-off stand-by circuit according to claim 1.

BRIEF DESCRIPTION OF THE DRAWINGS

The characteristics and advantages of the invention will become apparent from the description of a preferred but not exclusive embodiment of a switch-off stand-by circuit, according to the invention, illustrated only by way of non-limitative example in the accompanying drawings, wherein:

FIG. 1 is a schematic diagram of the stand-by switch-off circuit with external delay and switch-off means, according to the prior art;

FIG. 2 illustrates an embodiment of a per se known device as described for example in the SGS Data Book;

FIGS. 3a to 3c illustrate the delay time obtained with the circuit illustrated in FIG. 2;

DESCRIPTION OF THE PREFERRED EMBODIMENTS

Figure 4:
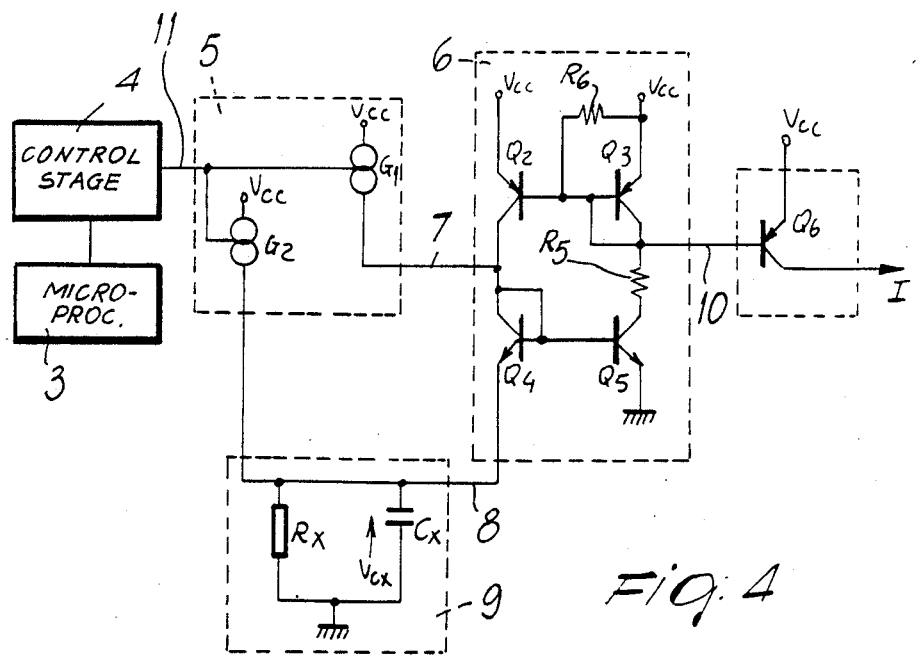
FIG. 4 is a view of the stand-by circuit and of the delay means according to the present invention.
Figure 5A:
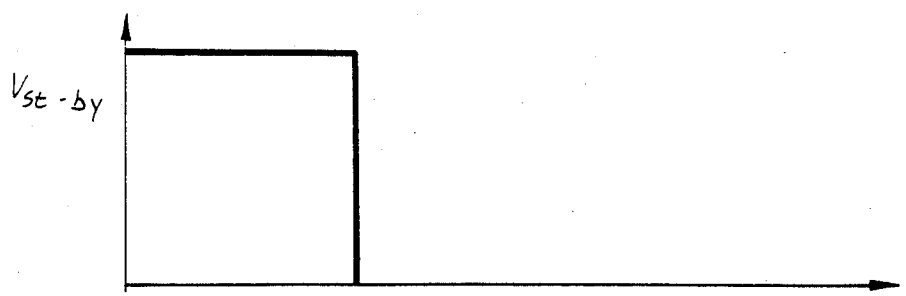
FIGS. 5a to 5c illustrate the delay time obtained with the stand-by circuit according to FIG. 4.
Figure 5B:
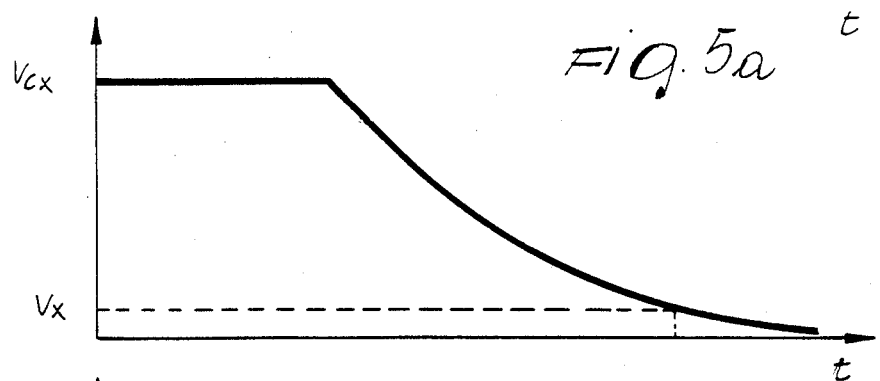
Figure 5C:
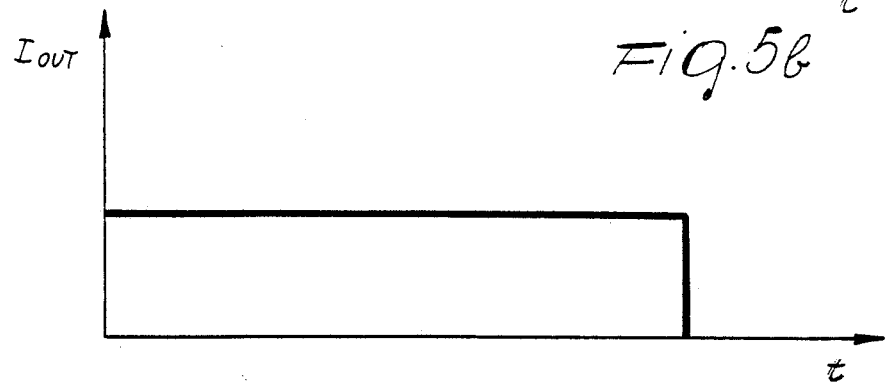

With reference to FIG. 4, the circuit comprises a controlled, constant-current source G1 which may be switched on and off by a voltage signal Vst-by (as shown in FIG. 5) generated by a microprocessor 3 and fed through the CMOS-compatible control block 4 at a stand-by input 11.

Furthermore the circuit according to the invention comprises a second constant current source G2 (comprised in block 5), said second current source being controlled by control block or stage 4 in the same manner as and simultaneously with G1. G2 (which may be implemented by a simple resistor) feeds delay means 9, including the parallel connection of a resistor Rx and a capacitor Cx and arranged between G2 and the ground.

It should be stressed that the capacitor Cx does not require apposite implementation, instead a capacitor may be used, which is already present in the user circuit to connect it to the ground.

Said circuit furthermore comprises a current loop 6 which advantageously comprises four transistors Q2, Q3, Q4 and Q5 in which the transistors Q2 and Q3 form a PNP current mirror and the transistors Q4 and Q5 form an NPN current mirror.

In detail, Q2 has its emitter connected to the power supply Vcc (defining a first reference potential line) and its base connected to the base of Q3 which is diode-connected, that is Q3 has its base and collector terminals mutually short-circuited, while the emitter of Q3 is connected to Vcc. Furthermore the collector of Q2 is connected to a first input 7 of the loop and to the collector of Q4 which is short-circuited to the base of Q4, which in turn is connected to the base of Q5, while the emitter of Q4 defines a second input 8 of the loop, connected to the delay means 9. Q5 further has its collector connected to the collector of Q3 (and to the output 10 of the loop circuit 6) and its emitter connected to the ground (defining a second reference potential line). Furthermore a current limitation resistor R5 may be provided between the collector of Q5 and output 10. The output 10 of current loop 6 is connected to a plurality of current sources in the user circuit (not shown), such current sources being schematically represented in the figure by transistor Q6. Furthermore a resistor R6 may be provided across the base to collector junction of Q3, such resistor being useful to set the loop switching off current.

The current loop 6 in practice is implemented so as to operate as a controlled current source with variable gain according to the control signal existing on the control inputs 7, 8. In particular the loop is implemented so as to feed the source transistor Q6 with the required current during standard operation (G1 fed with control voltage Vst-by and thus on and feeding the loop 6) and to have an open loop current gain (defined as the ratio between the currents flowing through Q2 and Q4, when the loop is opened at the connection point between these two transistors) lower than 1 when no control signal is present on input 7 and the voltage Vcx on control input 8 becomes lower than a preset threshold Vx, having a value of some tenth of millivolts, as will be explained in greater detail hereinafter.

In detail there are two ways to set the current gain of the loop so that it satisfies the above condition. A first method consists in appropriately selecting the areas of the emitter of transistors Q2-Q5 to make the current mirrors (PNP and NPN) incompatible. In fact, if Vcx=0, the current gain (Ai) of the loop is given by:

$$A_i = \frac{\text{Emitter area of } Q_5}{\text{Emitter area of } Q_4} \cdot \frac{\text{Emitter area of } Q_2}{\text{Emitter area of } Q_3}$$

In particular, by implementing transistors Q2 and Q3 so that they have the same emitter area, and making emitter area of Q4 ten times greater than the one of Q5, the current gain Ai, as above defined, is equal to 1/10, thereby assuring switching off of the loop also in actual operation.

Figure 6:
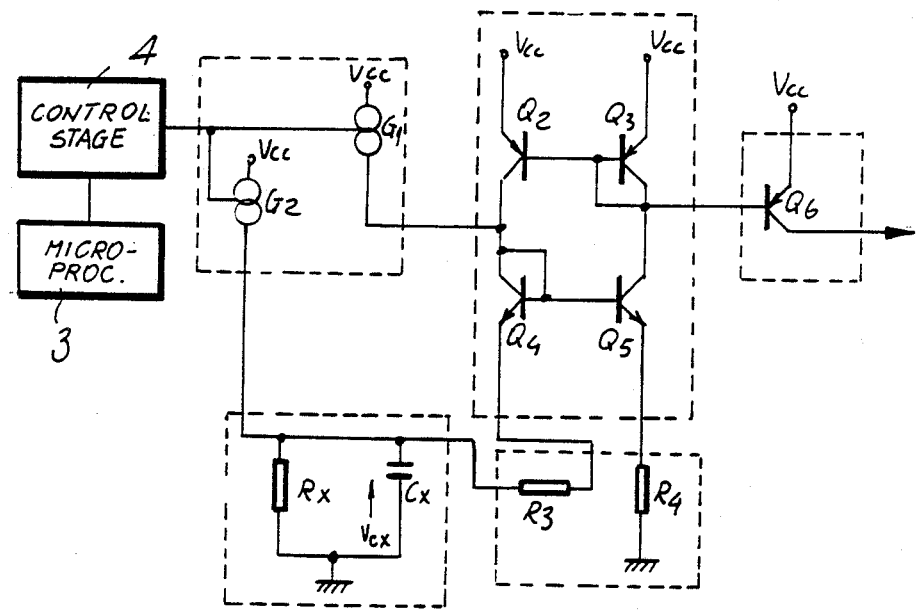
FIG. 6 is a view of a different embodiment of the circuit according to the present invention.

A second method is to degenerate the emitters of the transistors which constitute said loop by adding different resistors in series to the emitter of the transistors Q2-Q5. In particular in FIG. 6 a solution is presented, wherein resistors R3, R4, of different value, are respectively connected in series to the emitters of transistors Q4 and Q5. Such resistors cause the base to emitter drops of transistors Q4 and Q5, and thus the currents flowing therethrough, to be different. By appropriately selecting the resistance of R3 and R4 the open loop gain of the loop 6 may be set lower than 1 at the stand-by circuit lower threshold Vx.

The above two methods do not however exclude with each other, and the current gain of the loop during switching off may be set by varying the emitter areas of the transistors and simultaneously inserting emitter degeneration resistors.

The operation of the circuit according to the invention is as follows.

After switching on, after a fast transient, when the current sources G1 and G2 are in the "on" (operating) condition, the capacitor Cx is charged by a voltage which is determined by the current source G2 through resistor Rx, thus the transistor Q4 is in its "off" (inoperative) condition, due to the high potential at its emitter. When Q4 is "off", the current generated by G1 flows across the base of the transistor Q5 and switches on said transistor Q5 and the transistors Q2 and Q3. The current source Q6 is consequently switched "on" and supplies current to the electronic circuit.

When said sources G1 and G2 are switched to their "off" position, the capacitor Cx discharges with the time constant Tx (where Tx is equal to Rx.Cx, see also FIG. 5) and thus voltage Vcx decreases (see FIG. 5). When Vcx reaches the threshold voltage Vx (corresponding to the voltage at which the base-to-emitter voltage drop on transistor Q4 is sufficient to cause switching on of such transistor) Q4 begins to conduct, unbalancing the loop, so that the current gain of the loop becomes smaller than 1 and the loop, together with the current source Q6, are completely switched to the "off" position.

In practice, when the voltage Vcx on the delay means reaches the threshold Vx, a switching off signal is fed to the second control input 8 of the loop 6 to switch it off.

As illustrated in FIG. 5, the switch-off curve of said circuit depends on two factors:

(1) the time constant Rx Cx,
(2) the level of the threshold voltage Vx.

As may be appreciated from the foregoing description, the invention achieves the objects set forth. In fact the stand-by circuit according to the invention has a very low threshold (of the order of the tenth of millivolts, or, at the most, of 100 mV), resulting from the difference between the base-to-emitter voltage drop on Q5 and the switching-on base-to-emitter voltage of Q4.

By virtue of the structure as described, as the capacitor Cx an already existing capacitor may be used, in particular one connected to the user circuit through an own pin for connecting the user circuit to the ground, so that no further pin should be provided for Cx, thereby reducing the bulk of the integrated circuit including the user and the stand-by circuit.

Furthermore the circuit according to the invention does not require external means or components since all the components thereof may be accommodated in a single chip, possibly together with the user circuit and the stand-by function with delayed switch off may be obtained directly from the stand-by pin of the integrated circuit.

The presented solution is simple and may be easily integrated at reduced costs.

The invention herein is susceptible to many modifications and variations, all falling within the scope of the inventive concept. In particular, it is further stressed that the open-loop gain of the loop 6 lower than 1 may be obtained in different ways, as above indicated.

Furthermore all the details may be replaced with other technically equivalent ones.

We claim:

1. A low voltage-controlled, stand-by electronic circuit with delayed switch off, comprising a switching means defining a stand-by input receiving a stand-by switching signal switching between a first active state and a second disabling states, and delay means connected to said stand-by input and receiving said stand-by switching signal for generating a delayed switch off signal after switching of said stand-by switching signal from said first active to said second disabling state, said switching means including a controlled current source having a first and a second control inputs, said first control input being connected to said stand-by input and said second control input being connected to said delay means to receive said delayed switch off signal, said controlled current source being switched on upon said stand-by switching signal switching from said second disabling to said first active state and remaining on upon said stand-by switching signal switching from said first active to said second disabling state and in absence of said delayed switch off signal, said controlled current source being switched off by said delayed switch off signal on said second control input.

2. A circuit according to claim 1, wherein said controlled current source comprises a current loop having an open loop current gain lower than 1 upon receiving said delayed switch off signal.

3. A circuit according to claim 1, wherein said controlled current source comprises a first PNP and a second NPN current mirror means connected in series between a first reference potential line and a second reference potential line and defining an upper current mirror and a lower current mirror, said upper and lower current mirrors defining two connection points respectively defining said first control input and a circuit output, with said lower current mirror being connected to said delay means and defining said second control input.

4. A circuit according to claim 3, wherein said upper current mirror comprises a first transistor of the PNP type connected with its emitter terminal to said first reference potential line, with its collector terminal to said first control input and to said lower current mirror and a second PNP transistor connected with its emitter terminal to said first reference potential line, with its base terminal to a base terminal of said first transistor and with its collector terminal to said circuit output and to said second current mirror, and said second current mirror comprises a third NPN transistor connected with its collector terminal to said collector terminal of said first transistor, with its emitter terminal to said delay circuit and a fourth NPN transistor connected with its collector terminal to said collector terminal of said second transistor, with its base terminal with a base terminal of said third transistor and with its emitter terminal to said second reference potential line, said second and third transistors being diode connected.

5. A circuit according to claim 4, wherein said current mirrors define a current loop having an open loop gain, said transistors having emitter areas selected so that the open loop gain is lower than 1.

6. A circuit according to claim 4, wherein said current mirors define a current loop having an open loop gain, and emitter degeneration resistors of different resistance are arranged in series with the emitter terminal of said transistors, thereby the open loop gain is lower than 1.

7. A circuit according to claim 1, comprising a first voltage-controlled current source means connected between a first reference potential line and said first control input of said controlled current source and being controlled by said stand-by switching signal, and a second voltage-controlled current source mans connected between said first reference potential line and said delay means and being controlled by said stand-by switching signal.

* * * * *